United States Patent [19]

Sakurai et al.

[11] Patent Number: 4,683,382
[45] Date of Patent: Jul. 28, 1987

[54] POWER-SAVING VOLTAGE SUPPLY

[75] Inventors: Takayasu Sakurai, Tokyo; Tetsuya Iizuka, Funabashi, both of Japan

[73] Assignee: Kabushiki Kaisha Toshiba, Kawasaki, Japan

[21] Appl. No.: 667,417

[22] Filed: Nov. 1, 1984

[30] Foreign Application Priority Data

Feb. 22, 1984 [JP] Japan .................... 59-32068

[51] Int. Cl.[4] ........................ H03K 3/01; H03K 5/153; H01L 9/02; G06G 7/10
[52] U.S. Cl. ............................. 307/296 R; 307/200 B; 307/362; 307/491; 307/496; 365/227
[58] Field of Search ................................. 365/226–227; 307/200 B, 296 R, 491, 496, 497, 362, 585, 264, 540, 567, 568

[56] References Cited

U.S. PATENT DOCUMENTS 4,580,063  4/1986  Torelli et al. .................... 307/200 B
4,581,551  4/1986  Campbell, Jr. .................... 307/200 B

OTHER PUBLICATIONS

Mano et al., "Submission VLSI Memory Circuits," ISSCC Digest of Technical Papers, pp. 234–235, Feb. 1983.
Itoh et al., "An Experimental IBM DRAW with On-Chip Voltage Limiter," ISSCC Digest of Technical Papers, pp. 282–283, Feb. 1983.

Primary Examiner—Stanley D. Miller
Assistant Examiner—M. R. Wambach
Attorney, Agent, or Firm—Finnegan, Henderson, Farabow, Garrett & Dunner

[57] ABSTRACT

In a semiconductor device according to the invention, first and second voltage dropping circuits, for generating voltages respectively having smaller values than that of an external power supply voltage, are provided. The first voltage dropping circuit, which consumes relatively less power, is always in the operative mode, and the second voltage dropping circuit, which consumes more power than that of the first voltage dropping circuit, is operated during an interval other than a standby interval. The voltages generated by the first and second voltage dropping circuits are supplied to an internal power supply line in parallel with each other.

17 Claims, 7 Drawing Figures

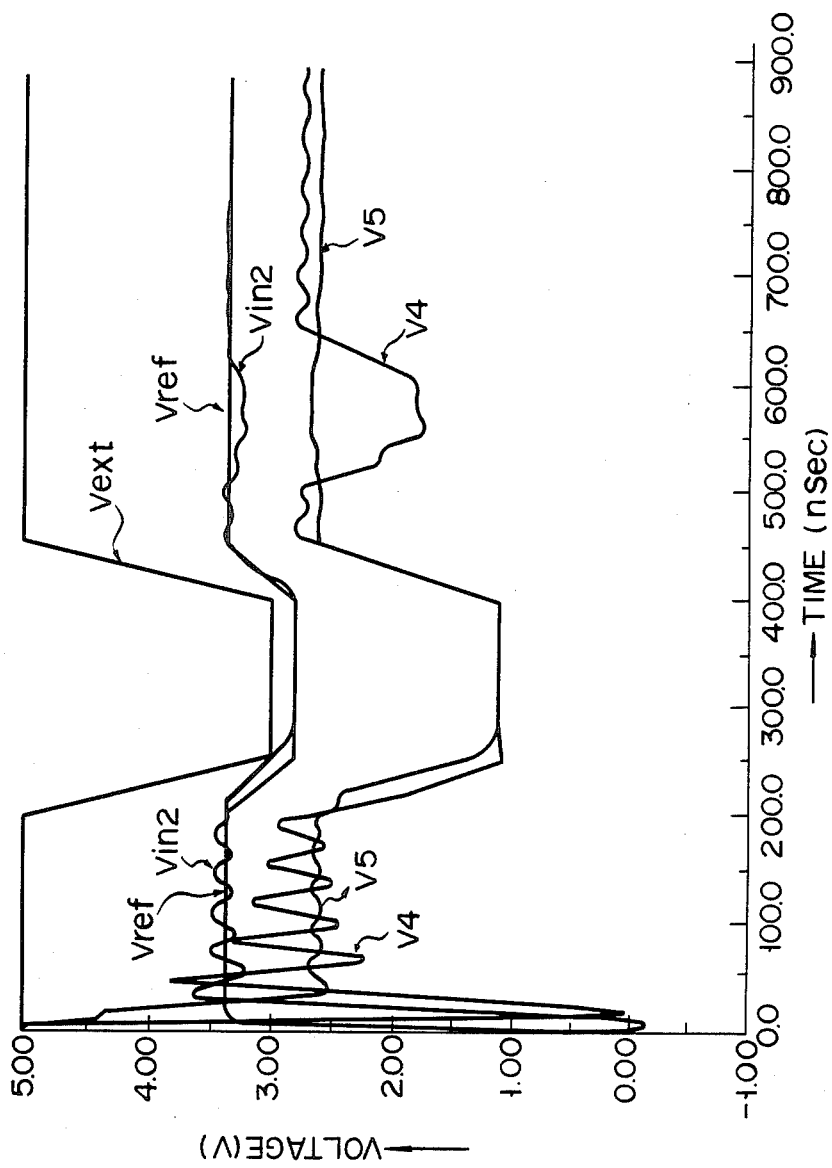

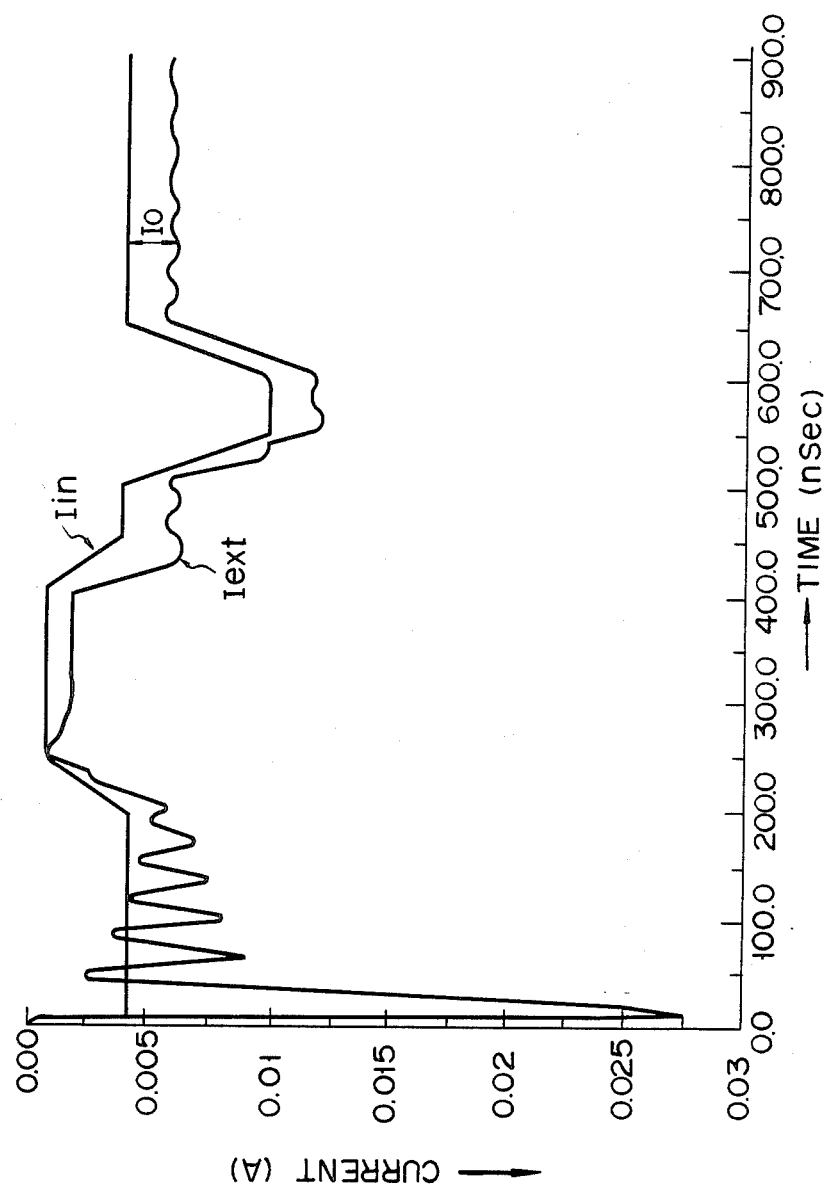

POWER-SAVING VOLTAGE SUPPLY

BACKGROUND OF THE INVENTION

The present invention relates to a semiconductor device in which a standby interval for reducing power consumption is provided, and in which an external power supply voltage is dropped so as to generate a lower voltage level than the external power supply voltage. This voltage is used as the internal voltage of the semiconductor device.

Recently, integrated circuits (ICs) using MOS transistors having an effective channel length of about 1 μm or less have been developed. In MOS transistors having a reduced effective channel length, when a voltage of 5 V, which is standard for transistor-transistor logic (TTL), is directly applied to the drain of an internal transistor, hot carriers are generated, thereby causing an undesirable gate current. Furthermore, the gate current is partially trapped by a trapping center in the gate insulation film and the gate insulation film is charged, thereby gradually changing the threshold voltage of the MOS transistor.

In order to prevent such a disadvantage, in the case wherein the external power supply voltage is 5 V, a voltage of 5 V or less, for example, 3 V, is obtained from the voltage of 5 V inside the semiconductor device. Then, this voltage of 3 V is applied to the MOS transistor having the reduced effective channel length. In this case, a voltage dropping circuit for dropping the external power supply voltage of 5 V so as to obtain a voltage of 3 V is needed. Such voltage dropping circuits are well-known as described in "Submicron VLSI Memory circuits", ISSCC Digest of Technical Papers, 1983, pp 234–235 by T. Mano et al, or in "An Experimental 1 Mb DRAM with On-Chip Voltage Limiter", ISSCC Digest of Technical Papers, 1984, pp 282–283 by K. Ito et al.

On the other hand, a semiconductor device such as a semiconductor memory having a so-called standby interval is also known. During the standby interval, an internal circuit is substantially stopped, and power consumption is reduced more than in the normal operating mode. During the standby interval, in order to control the overall power consumption of the semiconductor device, the power consumption in the voltage dropping circuit is preferably reduced. Then, in order to reduce power consumption in the voltage dropping circuit, the voltage dropping circuit is also stopped during the standby interval. However, in a semiconductor memory, more particularly, in a dynamic memory, since data holding is performed during the standby interval, the same power supply voltage as in the normal operating mode must be supplied. When the power supply voltage is abnormally low or high, data is destroyed, and normal operation after the standby interval cannot be expected. Therefore, it is not preferred to stop the power supply in the manner as described above, and the operation of the voltage dropping circuit cannot be stopped. In order to minimize the power consumption of the voltage dropping circuit without interrupting its operation, the voltage dropping circuit may be designed to minimize the current flowing thereto. However, when a current value is reduced so as to control the power consumption, the response time of the voltage which is dropped as an output voltage lags, and the constant voltage characteristic is lost.

In this manner, in a conventional voltage dropping circuit, a constant current flows therein during the standby interval. However, this current is useless and a back-up operation using a battery cannot be performed because of this current. Note that a current consumption of 2 mA is necessary to obtain a sufficient constant voltage characteristic in the conventional voltage dropping circuit. However, in order to perform a back-up operation using a battery, the current consumption must be controlled to be below 100 μA.

SUMMARY OF THE INVENTION

It is an object of the present invention to provide a semiconductor device in which an output voltage lower than an external power supply voltage can be stably obtained, and in which low power consumption can be achieved without adversely affecting the operation of the semiconductor device which uses the output voltage as a power supply voltage during a standby interval.

In order to achieve the above object of the present invention, there is provided a semiconductor device comprising an external terminal to which an external power supply voltage is supplied; an internal power supply line; first voltage dropping means operative during a standby interval for generating a first voltage having a lower value than that of the external power supply voltage so as to supply it to said internal power supply line; and a second voltage dropping means operative for an interval except for the standby interval for generating a second voltage having a lower value than that of the external power supply voltage so as to supply it to the internal power supply line.

BRIEF DESCRIPTION OF THE DRAWINGS

FIG. 4A is a graph showing changes over time of voltages at respective portions of the second voltage dropping circuit in the circuit of FIG. 3;

FIG. 4B is a graph showing changes over time in currents flowing into an external power supply line in the operative mode of the second voltage dropping circuit in the circuit of FIG. 3;

DETAILED DESCRIPTION OF THE PREFERRED EMBODIMENTS

The present invention will be described with reference to the accompanying drawings hereinafter.

Figure 1:
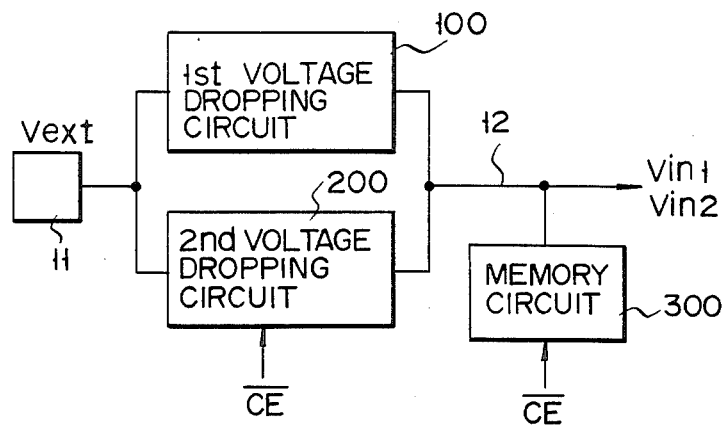
FIG. 1 is a block diagram showing a configuration according to an embodiment of the present invention.

FIG. 1 shows a block diagram of a configuration of a semiconductor device according to an embodiment of the present invention.

The semiconductor device of the present invention includes MOS transistors respectively having an effective channel length of 1 μm or less as memory cells. In this semiconductor device, first and second voltage dropping circuits 100 and 200 are provided which respectively generate internal power supply voltages Vin1 and Vin2 from an external power supply voltage Vext so as to respectively have lower values than that of the voltage Vext. The internal power supply voltages Vin1 and Vin2 which are respectively generated by the first and second voltage dropping circuits 100 and 200 are supplied to an internal power supply line 12. A memory circuit 300 including a plurality of MOS transistors respectively having an effective channel length of 1 μm or less as memory cells is connected to the internal power supply line 12. This memory circuit 300 is operated using the internal power supply voltage Vin1 or Vin2 as a power supply voltage. Furthermore, the memory circuit 300 has a standby interval for reducing power consumption in the non-selected mode. In other words, when a chip enable signal $\overline{CE}$ externally supplied through a chip enable terminal (not shown) is at 1 level during the standby interval, the internal operation of the memory circuit 300 is interrupted, thereby achieving low power consumption.

In the first and second voltage dropping circuits 100 and 200, an operation current of the first voltage dropping circuit 100 is set to be sufficiently lower than that of the second voltage dropping circuit 200. Furthermore, the first voltage dropping circuit 100 is operated regardless of the standby interval of the memory circuit 300. However, the standby interval, the chip enable signal $\overline{CE}$ is at 1 level, the operation of the second voltage dropping circuit 200 is stopped, and the internal power supply voltage Vin2 is not generated. As a result, the current consumption of the circuit 200 becomes substantially zero except for a leaking current or the like.

Since the second voltage dropping circuit 200 consumes more power than the first voltage dropping circuit 100, the response time of the internal power supply voltage Vin2 generated from the second voltage dropping circuit 200 is fast as compared to that of the internal power supply voltage Vin1 generated from the first voltage dropping circuit 100. The value of the internal power supply voltage Vin1 generated from the first voltage dropping circuit 100 is set to be substantially the same as that of the internal power supply voltage Vin2 generated from the second voltage dropping circuit 200. For example, when the voltage Vext is 5 V, the voltages Vin1, Vin2 are set at about 3.2 V.

In this configuration, when the chip enable signal $\overline{CE}$ goes to 0 level and the memory circuit 300 operates normally, that is, it performs a data access operation, and the second voltage dropping circuit 200 is operated so that the dropped internal power supply voltage Vin2 is obtained from the external power supply voltage Vext. The first voltage dropping circuit 100 is also operative. Thus, the internal power supply voltage Vin1 having the same value as that of the voltage Vin2 is also obtained from the voltage Vext, and is supplied to the internal power supply line 12 in parallel with the voltage Vin2. In this case, the voltage characteristic of the voltage in the internal power supply line 12 is held constant by the voltage Vin2 having the sufficiently fast response time from the second voltage dropping circuit 200. Therefore, the memory circuit 300 which uses the voltage in the internal power supply line 12 as the power supply voltage operates at a stable voltage of 3.2 V which is lower than the external power supply voltage Vext of 5 V.

In contrast, during the standby interval wherein the chip enable signal $\overline{CE}$ goes to 1 level, a data access operation in the memory circuit 300 is inhibited and only the data holding operation is performed, thereby achieving low power consumption in the memory circuit 300. During this standby interval, the first voltage dropping circuit 100 is operated, and the internal power supply voltage Vin1 is supplied to the internal power supply line 12. For this reason, during this standby interval, although the response time of the voltage Vin1 is slow and the constant voltage characteristic is slightly impaired, the voltage of 3.2 V which is lower than the external power supply voltage Vext is still supplied to the internal power supply line 12.

Since the power supply current flowing into the memory current during the standby interval is necessary only for holding data, it has a very small value. Therefore, the data holding operation in the memory circuit 300 can be stably performed by the output voltage (Vin1) having a long response time from the first voltage dropping circuit 100. Furthermore, during this standby interval, the operation of the second voltage dropping circuit 200 which consumes a lot of power is inhibited. Therefore, the consumption current of this circuit 200 becomes substantially zero. In this manner, the overall power consumption in an IC in which the voltage dropping circuits according to the present invention are provided can be considerably reduced, and the back-up operation by the battery during the standby interval can be performed.

Figure 2:
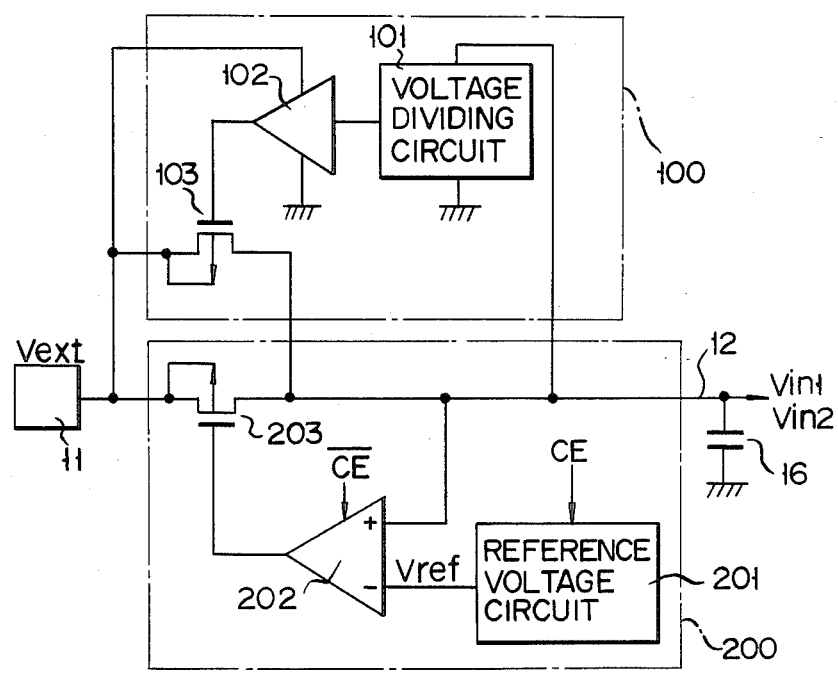
FIG. 2 is a circuit diagram showing a detailed configuration of first and second voltage dropping circuits in the above configuration.

FIG. 2 is a circuit diagram showing detailed configurations of the first and second voltage dropping circuits 100 and 200 in the above circuit of this embodiment, respectively. The first voltage dropping circuit 100 consists of a voltage dividing circuit 101, a voltage amplifier 102 and an enhancement-type p-channel MOS transistor 103 as a variable impedance means. The voltage dividing circuit 101 consists of a plurality of high impedance elements on the order of several mega ohms and divides the voltage of the internal power supply line 12 in accordance with a predetermined impedance ratio. The voltage amplifier 102 consists of a high impedance element on the order of several mega ohms as a load element and a MOS transistor as a driver element, and receives the external power supply voltage Vext as the power supply voltage and the output voltage of the voltage dividing circuit 101. Furthermore, the source and drain of the MOS transistor 103 are respectively connected between the external power supply terminal 11, and the internal power supply line 12 and the output voltage from the voltage amplifier 102 is supplied to the gate thereof.

In this voltage dropping circuit 100, when the voltage Vin1 of the internal power supply line 12 is increased from a predetermined voltage, the output voltage from the voltage amplifier 102 is also increased so as to increase the impedance between the source and the drain of the MOS transistor 103. A relatively large voltage drop then occurs between the source and the drain of the MOS transistor 103, thereby reducing the voltage Vin1 of the internal power supply line 12 toward the predetermined voltage.

When the voltage Vin1 of the internal power supply line 12 is decreased from the predetermined voltage, the output voltage from the voltage amplifier 102 is dropped so as to decrease the impedance between the source and the drain of the MOS transistor 103. Then, the voltage drop between the source and the drain of the MOS transistor 103 becomes small, and the voltage Vin1 of the internal power supply line 12 is increased toward the predetermined voltage. In this manner, in the circuit 100, the output voltage Vin1 is controlled to be constantly at the predetermined voltage.

The second voltage dropping circuit 200 consists of a reference voltage circuit 201, a differential amplifier 202 and an enhancement-type p-channel MOS transistor 203 as a variable impedance means. The reference voltage circuit 201 is controlled by the chip enable signal CE and is operated so as to generate a reference voltage Vref when the signal CE is at 1 level. The reference voltage Vref from the reference voltage circuit 201 is supplied to the inverting input terminal of the differential amplifier 202. The voltage on the internal power supply line 12 is supplied to the noninverting input terminal thereof. The differential amplifier 202 is controlled in accordance with the chip enable signal $\overline{CE}$ and is operated so as to compare these input voltages only when the signal $\overline{CE}$ is at 1 level. The source and the drain of the MOS transistor 203 are respectively connected between the external power supply voltage terminal 11 and the internal power supply line 12, and the gate thereof receives the output voltage from the differential amplifier 202.

In this voltage dropping circuit 200, during an interval other than the standby interval, the reference voltage Vref from the reference voltage circuit 201 and the voltage from the internal power supply line 12 are compared with each other by the differential amplifier 202. The comparison output thereof is supplied to the gate of the MOS transistor 203, thereby obtaining a dropped and stabilized voltage having the same value as that of the reference voltage Vref. Note that a capacitor 16 is inserted between the internal power supply line 12 and the ground.

Figure 3:
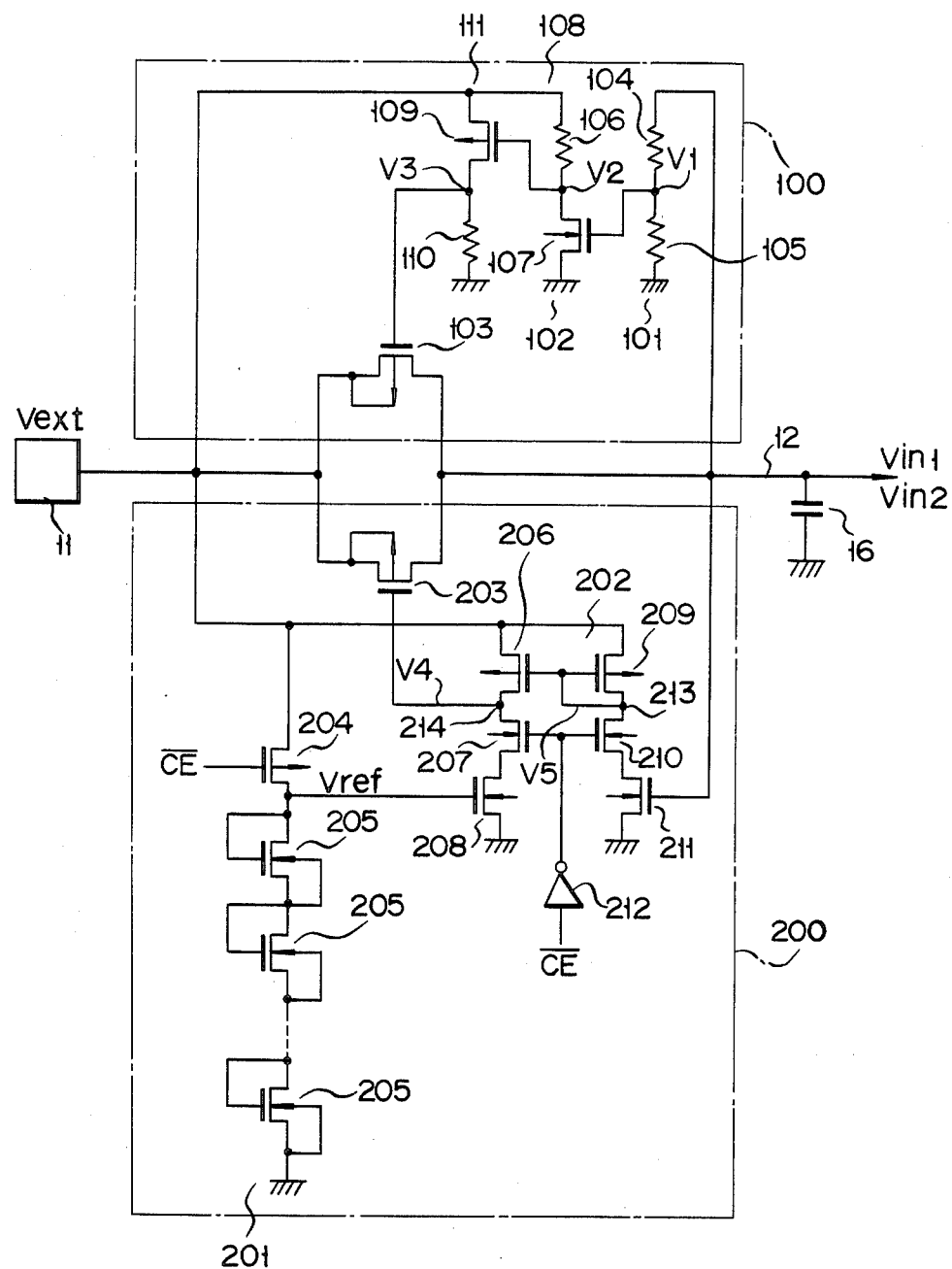
FIG. 3 is a circuit diagram showing the first and second voltage dropping circuits of FIG. 2 in more detail.

FIG. 3 is a circuit diagram showing the first and second voltage dropping circuits 100 and 200 shown in FIG. 2 in more detail.

The voltage dividing circuit 101 in the first voltage dropping circuit 100 consists of two resistors 104 and 105 which are inserted in series with each other between the internal power supply line 12 and the ground. The two resistors 104 and 105 are respectively set to have a resistance of several mega ohms. When the voltage of the internal power supply line 12 is set at 3.2 V, the resistances of the resistors 104 and 105 are respectively preset so that the divided voltage becomes, for example, 0.8 V.

The voltage amplifier 102 in the first voltage dropping circuit 100 consists of first and second inverting circuits 108 and 111. The first inverting circuit 108 consists of a resistor 106 as a load element and an enhancement-type n-channel MOS transistor 107 as a driver element which are inserted in series with each other between the terminal 11 and the ground. The second inverting circuit 111 consists of an enhancement-type p-channel MOS transistor 109 as a driver element and a resistor 110 as a load element which are inserted in series with each other between the terminal 11 and the ground. A divided voltage V1 from the voltage dividing circuit 101 is supplied to the gate of the MOS transistor 107 of the first inverting circuit 108. An output voltage V2 from the first inverting circuit 108 is supplied to the gate of the MOS transistor 109 of the second inverting circuit 111. Furthermore, an output voltage V3 of the second inverting circuit 111 is supplied to the gate of the MOS transistor 103 as the output voltage of the voltage amplifier 102. The resistors 106 and 110 respectively have a resistance of several mega ohms. The threshold voltage Vth of the MOS transistor 107 is set at 0.8 V.

The reference voltage circuit 201 in the second voltage dropping circuit 200 consists of one p-channel MOS transistor 204 as a switch which is inserted in series between the terminal 11 and the ground; and n n-channel MOS transistors 205 for generating a reference voltage. All the transistors 204 and 205 are of the enhancement-type. The chip enable signal CE is supplied to the gate of the transistor 204. The respective gates of the MOS transistors 205 are connected to the respective drains thereof.

In this reference voltage circuit 201, only when the chip enable signal $\overline{CE}$ is at 0 level and the transistor 204 is turned on, does a current flow in the series-connected n MOS transistors 205. As a result, a voltage n.Vth (i.e., n times the threshold voltage Vth of the respective MOS transistors 205) is generated as the reference voltage Vref from the drain side of the transistor 204. In the standby interval wherein the signal CE is at 1 level, the transistor 204 is turned off. For this reason, during the standby interval wherein the signal CE is at 1 level, no current flows in the reference voltage circuit 201, and therefore the voltage Vref is not generated.

The differential amplifier 202 in the second voltage dropping circuit 200 consists of a first current path comprising a p-channel MOS transistor 206 and two n-channel MOS transistors 207 and 208 which are series-connected between the terminal 11 and the ground; a second current path comprising a p-channel MOS transistor 209 and two n-channel MOS transistors 210 and 211 which are series-connected between the terminal 11 and the ground; and an inverter 212. The respective gates of the two p-channel transistors 206 and 209 are commonly connected, thereby constituting a load circuit of current mirror type. Furthermore, this common connecting point is connected to a series-connecting point 213 between the transistors 209 and 210. The reference voltage Vref from the reference voltage circuit 201 is supplied to the gate of the transistor 208. The voltage from the internal power supply line 12 is supplied to the gate of the transistor 211. The transistors 207 and 210 are used as switches for performing intermittent control of currents in the first and second current paths. The output of the inverter 212 to which the signal $\overline{CE}$ is supplied, is then supplied to the gates of the transistors 207 and 209 in parallel. A voltage V4 which is generated at a series-connecting point 214 between the two transistors 206 and 207 is supplied to the gate of the transistor 203.

In this differential amplifier 202, when the signal $\overline{CE}$ is at 1 level, the two transistors 207 and 210 are respectively turned off, and the current flowing in this circuit 202 thereby becomes substantially zero.

On the other hand, when the chip enable signal $\overline{CE}$ is at 0 level, the transistors 207 and 210 are respectively turned on, and the differential amplifier 202 is in the operative mode. In this case, the level of the output voltage V4 is determined in accordance with the level of the voltage which is supplied to the gates of the transistors 208 and 211. For example, when the voltage Vin2 is increased from the predetermined voltage and becomes higher than the reference voltage Vref, the impedance between the source and the drain of the transistor 211 is controlled to become small, thereby increasing the value of the current which flows there. However, this causes the value of the current which flows in the transistor 208 to become small, thereby increasing the value of the output voltage V4. Then, the impedance between the source and the drain of the p-channel MOS transistor 203 as the variable impedance means is controlled to become high. Therefore, a relatively large voltage drop occurs between the source and the drain of the MOS transistor 203 and the voltage Vin2 of the internal power supply line 12 is decreased toward the predetermined voltage.

When the voltage Vin2 of the internal power supply line 12 is decreased from the predetermined voltage and becomes lower than the reference voltage Vref, the value of the output voltage V4 from the differential amplifier 202 becomes low. The impedance between the source and the drain of the p-channel MOS transistor 203 as the variable impedance means is controlled to be low. The voltage drop generated between the source and the drain of the MOS transistor 203 thereby becomes small, and the voltage Vin2 of the internal power supply line 12 is increased toward the predetermined voltage. In this manner, the second voltage dropping circuit 200 is controlled in such a manner that the output voltage Vin2 is constantly held at the predetermined voltage.

FIG. 4A is a graph showing voltages at respective portions in the second voltage dropping circuit 200 as a function of time, wherein time is plotted along the abscissa and voltage is plotted along the ordinate. Note that in FIG. 4A, a voltage V5 is a voltage at the series-connecting point 213 in the differential amplifier 202.

As is apparent from FIG. 4A, even if the external power supply voltage Vext is changed, the voltage Vin2 of the internal power supply line 12 is controlled so as to coincide with the reference voltage Vref at the fast response time.

FIG. 4B is a graph showing a current Iin, which flows in the internal power supply line 12 when the voltage dropping circuit 200 is operated, as a function of time. Note that, in FIG. 4B, a current Iext is a current which is supplied from an external circuit. An average value of a consumption current Io of the second voltage dropping circuit 200 which is a difference between the currents Iext and Iin is set at about 2 mA.

Figure 5:
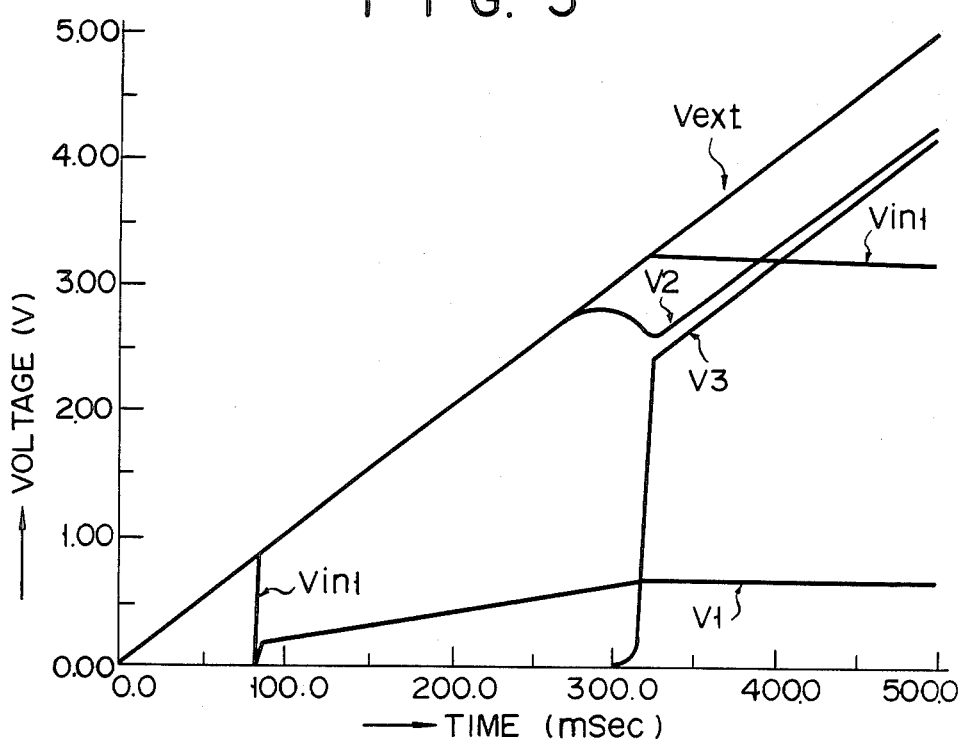
FIG. 5 is a graph showing a voltage as a function of time when the first voltage dropping circuit starts to operate.

FIG. 5 is a graph showing voltages at respective portions when the first voltage dropping circuit 100 is operated as a function of time. As shown in FIG. 5, the value of the voltage Vin1 reaches 3.2 V within about 300 msec after the first voltage dropping circuit 100 is operated.

Figure 6:
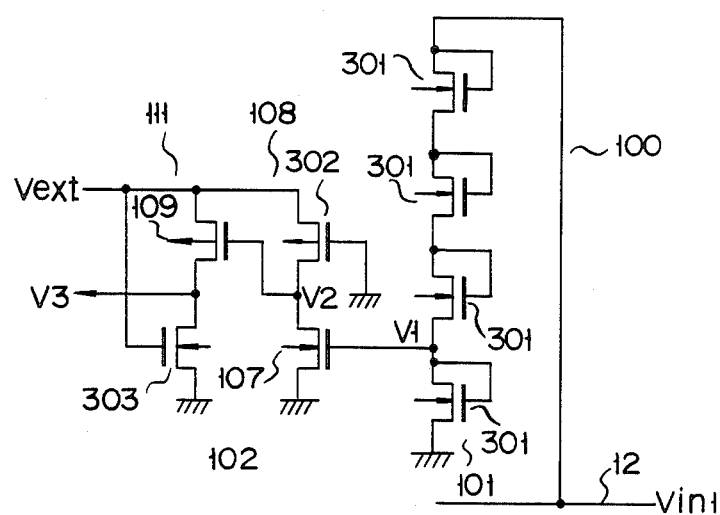
FIG. 6 is a circuit diagram showing a configuration of the first voltage dropping circuit according to another embodiment of the present invention.

FIG. 6 is a circuit diagram showing a circuit configuration of the first voltage dropping circuit 100 in FIG. 1 according to another embodiment of the present invention. In this embodiment, MOS transistors having substantially the same impedance as that of the resistors 104, 105, 106 and 110 having a value on the order of several mega ohms are used instead of these resistors.

The voltage dividing circuit 101 which divides the voltage of the internal power supply line 12 in accordance with the predetermined impedance ratio comprises m p-channel MOS transistors 301 which are respectively series-connected between the internal power supply line 12 and the ground. Each of these transistors 301 has a channel width W of about 2 μm and channel length L of about 100 μm. The ratio W/L of the channel width W to the channel length L is set to be 2/100. In the transistors having such an element, the impedance between the source and the drain is set to be several mega ohms, and the voltage V1 is divided by a dividing ratio in accordance with the impedance ratio of these transistors.

In the voltage amplifier 102, a p-channel MOS transistor 302 in which the ground voltage is supplied to the gate thereof is used in place of the resistor 106. This transistor 302 also has a ratio W/L of channel width W to channel length L of 2/100, and the impedance between the source and the drain thereof is set to be several mega ohms.

In the voltage amplifier 102, an n-channel MOS transistor 303 in which the external power supply voltage Vext is supplied to the gate thereof is used instead of the resistor 110. This transistor 303 also has a ratio W/L of channel width W to channel length L of 2/100, and the impedance between the source and the drain thereof is set to be several mega ohms.

It should be noted that these transistors 301, 302 and 303 are of the enhancement-type.

The present invention is not limited to the above embodiments, and various changes and modifications may be made within the spirit and scope of the present invention. For example, the first voltage dropping circuit 100 does not always have the configuration as shown in FIGS. 2 and 3. Any configuration may be adopted if a consumption current is lower than that of the second voltage dropping circuit 200. For example, as a modification of the first voltage dropping circuit 100, in the second voltage dropping circuit 200 of FIG. 3, a resistor having a resistance of several mega ohms or a transistor having the same impedance as that of the above resistor can be used instead of the transistor 204 which is controlled by the chip enable signal CE. In addition, the transistors 207 and 210 are omitted from the second voltage dropping circuit 200, and the ratio W/L of channel width W to channel length L of the transistors 206 and 209 can be set to be, for example, 2/100, thereby minimizing the constant current so as to achieve low power consumption.

What is claimed is:

1. A semiconductor device comprising:
    an external power supply terminal to which an external power supply voltage is supplied;
    an internal power supply line;
    first voltage dropping means, connected between said external power supply terminal and said internal power supply line, operative in at least a standby interval, for generating a first voltage having a smaller value than that of the external power supply voltage to supply the first voltage to said internal power supply line; and
    second voltage dropping means, connected between said external power supply terminal and said internal power supply line, operative in an interval other than the standby interval for generating a second voltage having a smaller value than that of the external power supply voltage to supply the second voltage to said internal power supply line.

2. A semiconductor device comprising:
    an external power supply terminal to which an external power supply voltage is supplied;
    an internal power supply line;
    an internal circuit, connected to said internal power supply line, having a standby interval for reducing power consumption and being operated using a voltage of said internal power supply line as a power supply voltage;
    first voltage dropping means, connected between said external power supply terminal and said internal power supply line, operative in the standby interval, for generating a first voltage having a lower value than that of the external power supply voltage to supply the first voltage to said internal power supply line; and second voltage dropping means, connected between said external power supply terminal and said internal power supply line, operative in an interval other than the standby interval, for generating a second voltage having a lower value than that of said external power supply voltage to supply the second voltage to said internal power supply line.

3. A semiconductor device according to claim 2, wherein said first voltage dropping means is operated at all times.

4. A semiconductor device according to claim 2, wherein a first current consumption when said first voltage dropping means is in an operative mode is lower than a second current consumption of said second voltage dropping means.

5. A semiconductor device according to claim 2, wherein said first voltage dropping means includes a plurality of impedance elements each having an impedance of at least more than several mega ohms which are respectively inserted in direct current paths.

6. A semiconductor device according to claim 2, wherein said first voltage dropping means includes
voltage dividing means for dividing the voltage of said internal power supply line;
voltage amplifying means, to which a voltage of said external terminal is supplied as an operating voltage, for amplifying a voltage which is divided by said voltage dividing means; and
variable impedance means, inserted between said external terminal and said internal power supply line, and an impedance controlled in accordance with an output from said voltage amplifying means.

7. A semiconductor device according to claim 2, wherein said second voltage dropping means includes
reference voltage generating means, operative only in an interval other than the standby interval, for generating a predetermined reference voltage;
voltage comparing means, operative only in an interval other than the standby interval, for comparing a voltage of said internal power supply line with the reference voltage; and
variable impedance means, inserted between said external terminal and said internal power supply line and an impedance controlled in accordance with output from said voltage comparing means.

8. A semiconductor device according to claim 6, wherein said voltage dividing means includes a plurality of impedance elements each having a resistance of several mega ohms and being connected in series with each other.

9. A semiconductor device according to claim 6, wherein said voltage amplifying means includes an inverting circuit including a load element having a resistance of several mega ohms and a metal oxide semiconductor transistor as a driver.

10. A semiconductor device according to claim 6, wherein said variable impedance means includes a metal oxide semiconductor transistor having a gate to which an output from said voltage amplifying means is supplied.

11. A semiconductor device according to claim 8, wherein said plurality of impedance elements are resistors.

12. A semiconductor device according to claim 8, wherein said plurality of impedance elements are metal oxide semiconductor transistors.

13. A semiconductor device according to claim 9, wherein said load element is a resistor.

14. A semiconductor device according to claim 9, wherein said load element is a metal oxide semiconductor transistor.

15. A semiconductor device according to claim 7, wherein said reference voltage generating means includes
switching means, being controlled to switch in accordance with a control signal, for controlling the standby interval; and
a plurality of metal oxide semiconductor transistors, being connected in series, and generating a constant voltage when a current is supplied through said switching means.

16. A semiconductor device according to claim 7, wherein said voltage comparing means includes a differential amplifier including first and second current paths, and a switching means, being controlled to switch in accordance with a control signal, for controlling the standby interval, said differential amplifier and said switching means being respectively inserted in said first and second current paths.

17. A semiconductor device according to claim 7, wherein said variable impedance means includes a metal oxide semiconductor transistor having a gate to which an output from said voltage comparing means is supplied.

* * * * *